United States Patent
Dang et al.

(10) Patent No.: US 10,062,622 B2
(45) Date of Patent: Aug. 28, 2018

(54) ELECTROLYTIC SEAL

(71) Applicant: International Business Machines Corporation, Armonk, NY (US)

(72) Inventors: Bing Dang, Chappaqua, NY (US); Yu Luo, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/440,032

(22) Filed: Feb. 23, 2017

(65) Prior Publication Data

US 2018/0090404 A1 Mar. 29, 2018

Related U.S. Application Data

(62) Division of application No. 15/275,887, filed on Sep. 26, 2016.

(51) Int. Cl.
| | | |
|---|---|---|
| *H01L 23/02* | (2006.01) | |
| *H01L 23/10* | (2006.01) | |
| *H01L 31/0203* | (2014.01) | |
| *H01L 21/48* | (2006.01) | |
| *B81B 7/00* | (2006.01) | |
| *B81C 1/00* | (2006.01) | |

(52) U.S. Cl.
CPC ............ *H01L 23/10* (2013.01); *B81B 7/0058* (2013.01); *B81C 1/00269* (2013.01); *H01L 21/4817* (2013.01); *H01L 31/0203* (2013.01); *B81C 2203/038* (2013.01)

(58) Field of Classification Search
CPC . H01L 23/10; H01L 21/4817; H01L 31/0203; B81C 1/00269; B81C 2203/038; B81B 7/0058
See application file for complete search history.

(56) References Cited

U.S. PATENT DOCUMENTS

| | | | | |
|---|---|---|---|---|
| 4,620,661 | A * | 11/1986 | Slatterly ............. | H01L 21/4817 205/176 |
| 8,455,996 | B1 * | 6/2013 | Chen ................... | B81C 1/00269 257/698 |
| 2003/0010808 | A1 * | 1/2003 | Uhland ................ | A61K 9/0097 228/110.1 |
| 2004/0058476 | A1 * | 3/2004 | Enquist .............. | B81C 1/00269 438/114 |

(Continued)

OTHER PUBLICATIONS

U.S. Appl. No. 15/440,032, filed Feb. 23, 2017.

(Continued)

*Primary Examiner* — Victor A Mandala
(74) *Attorney, Agent, or Firm* — Cantor Colburn LLP; Louis Percello

(57) ABSTRACT

A semiconductor device includes a first bonding surface disposed on a first component of the semiconductor device. A bond material is disposed on the first bonding surface, and a second bonding surface is disposed on a second component of the semiconductor device. The bond material is disposed on the second bonding surface. A first electroplated bond connects the bond material and the first bonding surface, and a second electroplated bond connects the bond material and the second bonding surface.

10 Claims, 7 Drawing Sheets

(56) References Cited

U.S. PATENT DOCUMENTS

| | | | |
|---|---|---|---|
| 2010/0059897 A1* | 3/2010 | Fay | H01L 24/03 257/777 |
| 2010/0283138 A1* | 11/2010 | Chen | B81C 1/00269 257/678 |
| 2013/0277777 A1* | 10/2013 | Chang | B81B 7/00 257/418 |
| 2014/0035167 A1* | 2/2014 | Schelling | H01L 21/4814 257/782 |

OTHER PUBLICATIONS

U.S. Appl. No. 15/275,887, filed Sep. 26, 2016.
Dang et al., "Electrolytic Seal," U.S. Appl. No. 15/275,887, filed Sep. 26, 2016.
List of IBM Patents or Patent Applications Treated as Related; Date Filed: Feb. 23, 2017, 2 pages.

* cited by examiner

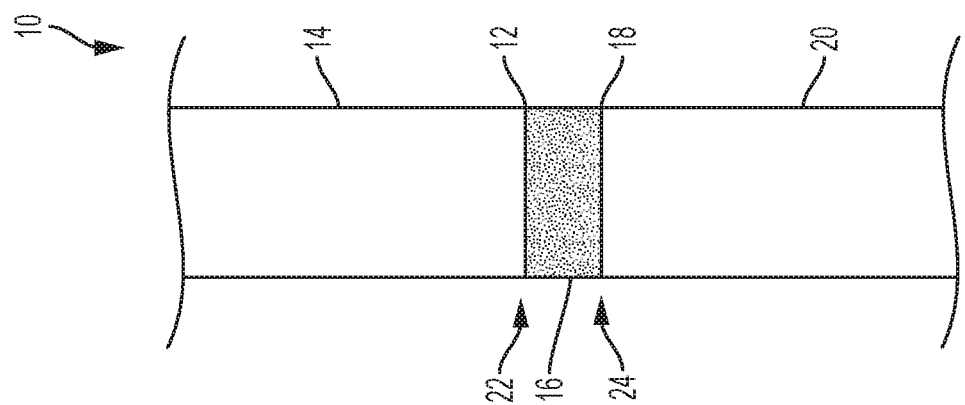

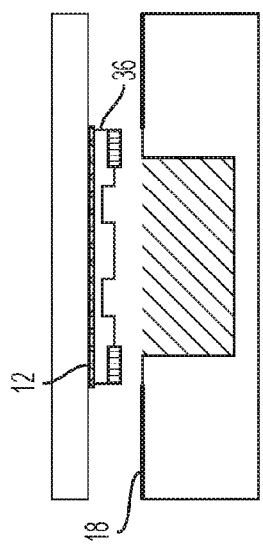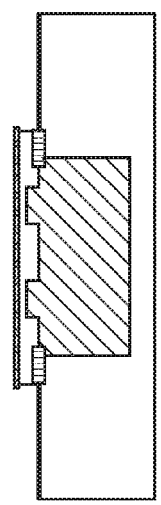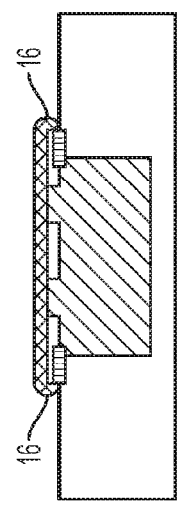
FIG. 5A
FIG. 5B
FIG. 5C

ELECTROLYTIC SEAL

DOMESTIC PRIORITY

This application is a divisional of U.S. application Ser. No. 15/275,887, titled "ELECTROLYTIC SEAL" filed Sep. 26, 2016, the contents of which are incorporated by reference herein in its entirety.

BACKGROUND

The present invention generally relates to sealed device components and structures. More specifically, the present invention relates to providing integrated circuit (IC), micro electromechanical system (MEMS), and micro battery structures having one or more components connected by an atomic level electrolytic seal, which can also be a hermetic seal.

Semiconductor devices and other electronic components are used in a variety of electronic applications. ICs are typically formed from various circuit configurations of semiconductor devices and other electronic components formed on and in semiconductor wafers. After completion of device level and interconnect level fabrication processes, the semiconductor devices and electronic components on the wafer are separated into micro-chips (i.e., chips), and the final product is packaged. IC packaging typically involves encasing the silicon chip(s) inside a hermetically sealed plastic, metal, or ceramic package that prevents the chip(s) from being damaged by exposure to dust, moisture, or contact with other objects. IC packaging also allows easier connections to a printed circuit board (PCB). The purpose of a PCB is to connect ICs and discreet components together to form larger operational circuits. Hermetic sealing methods commonly require high-yield bonding methods, and most metallic bonding involves high temperatures. However, for hermetically sealing components of temperature sensitive IC structures, MEMS devices, micro batteries, and the like, high temperature hermetic sealing methods can be unsuitable. Other hermetic sealing methods, including wafer bonding, high vacuum bonding, and fast wafer bonding, are often cost prohibitive.

SUMMARY

According to one or more embodiments of the present invention, a semiconductor device includes a bond material on a first bonding surface of a first component of the semiconductor device. The bond material is also on a second bonding surface of a second component of the semiconductor device. A first electroplated bond connects the bond material and the first bonding surface. A second electroplated bond connects the bond material and the second bonding surface, thereby physically coupling the first component and the second component through the bond material that is deposited by electrolytic plating.

According to one or more embodiments of the present invention, a method for forming a semiconductor device includes disposing a bond material on a first bonding surface of a first component of the semiconductor device. The method further includes disposing the bond material on a second bonding surface of a second component of the semiconductor device. The method further includes connecting the bond material and the first bonding surface to form a first electroplated bond. The method further includes connecting the bond material and the second bonding surface to form a second electroplated bond, thereby physically coupling the first component and the second component through the bond material that is deposited by electrolytic plating.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 1 illustrates a cross-sectional view of a structure having a bonding material between two components of a semiconductor device according to one or more embodiments of the present invention;

FIG. 5A illustrates a cross-sectional view of a structure after an initial fabrication stage according to one or more embodiments of the present invention;

FIG. 5B illustrates a cross-sectional view of a structure after an intermediary fabrication stage according to one or more embodiments of the present invention;

FIG. 5C illustrates a cross-sectional view of a structure after another intermediary fabrication stage according to one or more embodiments of the present invention;

DETAILED DESCRIPTION

Figure 2A:
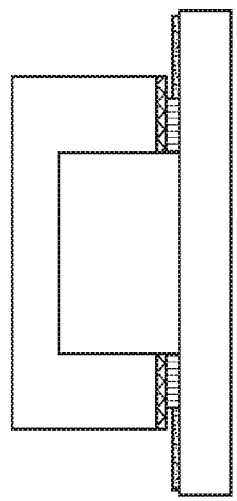
FIG. 2A illustrates a cross-sectional view of a structure after an initial fabrication stage according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor devices and fabrication methods may or may not be described in detail herein. Moreover, the various tasks and process steps described herein can be incorporated into a more comprehensive procedure or process having additional steps or functionality not described in detail herein. In particular, various steps in the manufacture of semiconductor devices are well known and so, in the interest of brevity, many conventional steps will only be mentioned briefly herein or will be omitted entirely without providing the well-known process details.

Turning now to an overview of the present invention, the illustrated exemplary embodiments described herein provide for a unique semiconductor device that has an electrolytic bond between semiconductor components, wherein the electrolytic bond can, in some embodiments, form a hermetic seal between the semiconductor components, some of which are described in the immediately following paragraphs.

Turning now to a more detailed description of embodiments of the present invention, FIG. 1 illustrates portions of an exemplary IC structure 10 according to embodiments of the present invention. IC structure 10 includes a first component 14 and a second component 20. The design requirements of the IC structure 10 can require that the first and second components 14, 20 are physically bonded together. The design requirements of the IC structure 10 can also require that the first and second components 14, 20 are physically bonded together in a manner that forms a hermetic seal. The first component 14 includes a first bonding surface 12, and the second component 20 includes a second bonding surface 18. A bond material 16 is disposed on the first bonding surface 12 and the second bonding surface 18 through electrolytic plating. In accordance with aspects of the present invention, a first electroplated bond 22 connects the bond material 16 and the first bonding surface 12, and a second electroplated bond 24 connects the bond material 16 and the second bonding surface 18.

According to one or more embodiments, the first electroplated bond 22 and the second electroplated bond 24 are each atomic level hermetic seals. According to one or more embodiments, the bond material 16 includes a metal or a metal alloy. Non-limiting examples of suitable metals include, but are not limited to, zinc, nickel, indium, copper, gold, and combinations including at least one of the foregoing. Non-limiting examples of suitable metal alloys include, but are not limited to, a zinc alloy, a nickel alloy, a tin alloy, an indium alloy, a copper alloy, a gold alloy, and a combination including at least one of the foregoing. In one or more embodiments, the metal alloy includes at least one of SnAg, SnAu, SnBi, ZnIn, ZnBi, or a combination thereof.

According to an exemplary embodiment, at least one of the first component and the second component is a material selected from a silicon oxide, a ceramic, a polymer laminate, or a combination thereof. Any suitable component of a semiconductor device can be bonded according to the embodiments of the present description.

According to an exemplary embodiment, the bond material 16 further includes a first layer material disposed on the first bonding surface 12 and a second layer material disposed on the second bonding surface 18. Without being bound by theory, the bond material 16 can be described as a composite material having atomic level bonding between the bond material 16 disposed on the first bonding surface 12, the first layer material, the bond material 16 disposed on the second bonding surface 18, and the second layer material. The bond material 16 can therefore provide an atomic level hermetic seal between the first component 14 and the second component 20 of the IC structure 10.

According to an exemplary embodiment, the first layer material and the second layer material each includes a metal or a metal alloy. Non-limiting examples of suitable metals include, but are not limited to, zinc, nickel, indium, copper, gold, palladium, platinum, and combinations including at least one of the foregoing. Non-limiting examples of suitable metal alloys include, but are not limited to, a zinc alloy, a nickel alloy, a tin alloy, an indium alloy, a copper alloy, a gold alloy, a palladium alloy, a platinum alloy, a tin alloy, a bismuth alloy, and a combination including at least one of the foregoing. In an exemplary embodiment, the metal alloy includes at least one of SnAg, SnAu, SnBi, ZnIn, ZnBi, or a combination thereof.

According to an exemplary embodiment, the first layer material and the second layer material each includes the same materials. According to another exemplary embodiment, the first layer material and the second layer material each includes different materials. In another embodiment, the first layer material, the second layer material, and the bond material 16 each includes the same materials. In an exemplary embodiment, the first layer material, the second layer material, and the bond material 16 each includes different materials.

Figure 2B:
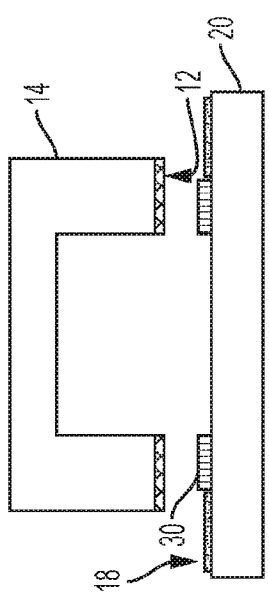
FIG. 2B illustrates a cross-sectional view of the structure after an intermediary fabrication stage according to one or more embodiments of the present invention.
Figure 2C:
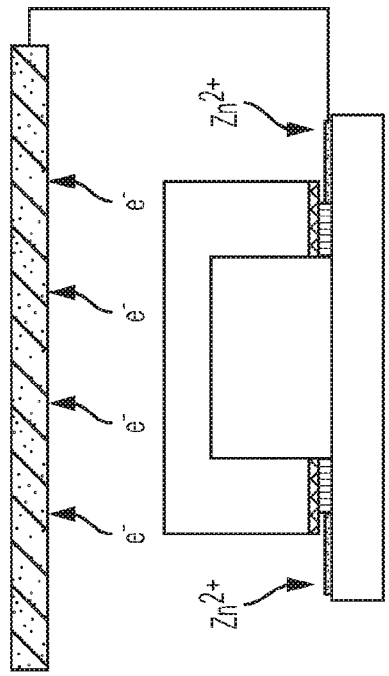
FIG. 2C illustrates a cross-sectional view of the structure after another intermediary fabrication stage according to one or more embodiments of the present invention.
Figure 2D:
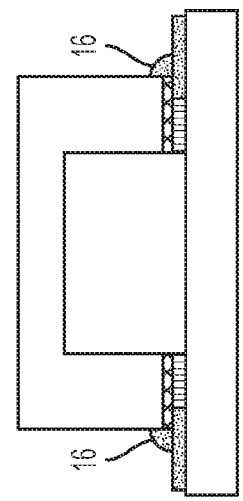
FIG. 2D illustrates a cross-sectional view of the structure after another intermediary fabrication stage according to one or more embodiments of the present invention.
Figure 3B:
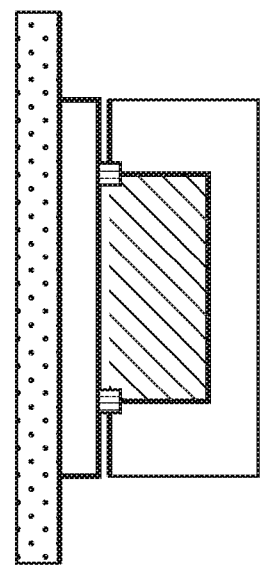
FIG. 3B illustrates a cross-sectional view of a structure after an intermediary fabrication stage according to one or more embodiments of the present invention.
Figure 3D:
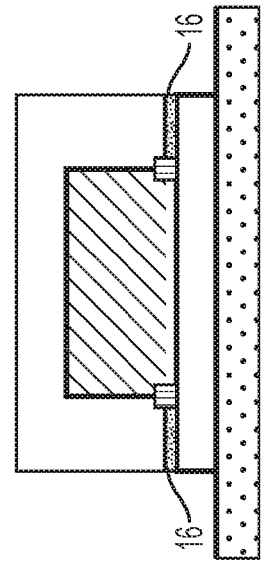
FIG. 3D illustrates a cross-sectional view of a structure after another intermediary fabrication stage according to one or more embodiments of the present invention.
Figure 3A:
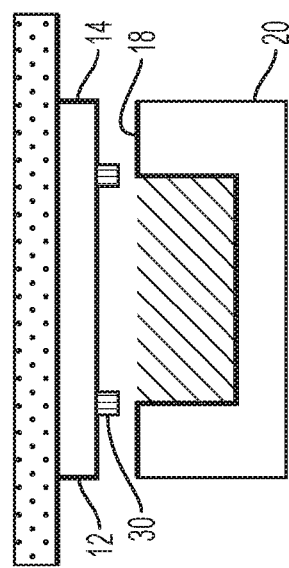
FIG. 3A illustrates a cross-sectional view of a structure after an initial fabrication stage according to one or more embodiments of the present invention.
Figure 3C:
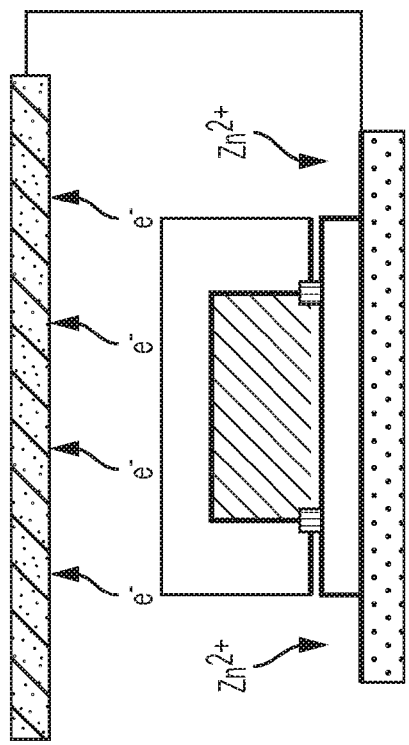
FIG. 3C illustrates a cross-sectional view of a structure after another intermediary fabrication stage according to one or more embodiments of the present invention.

FIGS. 2A-2D illustrates a method for forming a IC structure 10 that includes disposing a bond material 16 on a first bonding surface 12 of a first component 14 of the IC structure 10 (FIG. 2A); disposing the bond material 16 on a second bonding surface 18 of a second component 20 of the IC structure 10 (FIG. 2A); connecting the bond material 16 and the first bonding surface 12 to form a first electroplated bond; and connecting the bond material 16 and the second bonding surface 18 to form a second electroplated bond (FIGS. 2B-2D).

According to an exemplary embodiment, a temporary adhesive 30 can be used to position the first component 14 and the second component 20 prior to electrolytic bonding between the bonding surfaces 12, 18 and the bond material 16 (FIG. 2A). Any suitable material can be used as the temporary adhesive 30.

As illustrated in FIG. 2B, the temporary adhesive 30 secures the first component 14 and the second component 20 in a manner that facilitates bonding between the bonding surfaces 12, 18 and the bond material 16. An electrolytic method is then used to plate and hermetically seal the region between the first component 14 and the second component 20 (FIG. 2C), which subsequently connects the first component 14 and the second component 20 via an atomic level hermetic seal (FIG. 2D).

According to an exemplary embodiment, the bond material 16 is electrolytically deposited on the first bonding surface 12 of the first component 14. The bond material is also electrolytically deposited on the second bonding surface 18 of the second component 20.

The first bonding surface, and the second bonding surface, can be formed by any suitable deposition processes, for example, physical vapor deposition (PVD), chemical vapor deposition (CVD), plasma-enhanced chemical vapor deposition (PECVD), atomic layer deposition (ALD), evaporation, chemical solution deposition, plating, thermal or e-beam evaporation, sputtering, or other like processes. In an exemplary embodiment, the electroplated bonds can be formed at an ambient temperature of about 20-40° C.

As illustrated in FIGS. 3A-3D, the device can further include a cavity defined by a region between the first component 14, the second component 20, and the first and second electroplated bonds. In an exemplary embodiment, the device includes one or more first electroplated bonds and one or more second electroplated bonds.

Figure 4B:
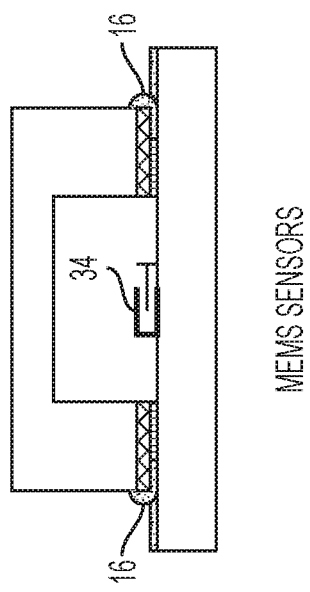
FIG. 4B illustrates a cross-sectional view of a structure including a MEMS (micro-electromechanical system) sensor.
Figure 4A:
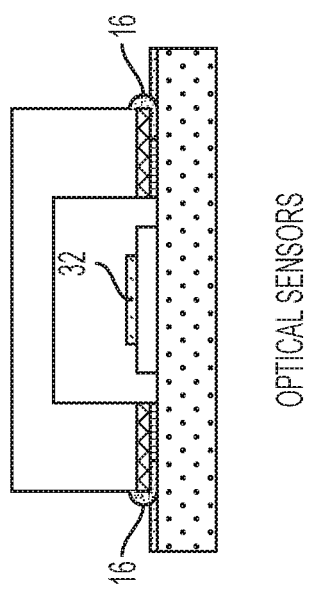
FIG. 4A illustrates a cross-sectional view of a structure including an optical sensor according to one or more embodiments of the present invention.

As illustrated in FIGS. 4A and 4B, the cavity of the device can include a sensor device. The sensor device is first sealed into the cavity with temporary adhesive 30 before electrolytic plating hermetically seals the sensor device within the cavity. FIG. 4A includes an optical sensor and FIG. 4B includes a MEMS sensor, although any suitable sensor device can be included.

As illustrated in FIGS. 5A-5C, the semiconductor device can include a drug delivery device. The drug delivery device can include a releasable membrane 36 that can be used to form and close the cavity of the device. The cavity of the drug delivery device can include any suitable medical component, including but not limited to a pharmaceutical composition. The releasable membrane 36 includes a first bonding surface 12 which is hermetically bonded with the second bonding surface 18 to form the cavity (FIG. 5C). The resulting device includes the drug delivery device that is hermetically sealed within the cavity. The releasable membrane 36 can be configured to controllably release one or more components of the drug delivery device under defined biological or physiological conditions.

Figure 6A:
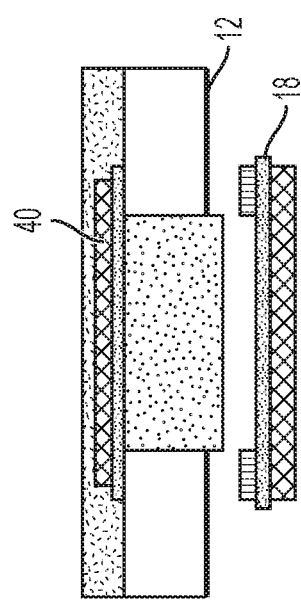
FIG. 6A illustrates a cross-sectional view of a structure after an initial fabrication stage according to one or more embodiments of the present invention.
Figure 6B:
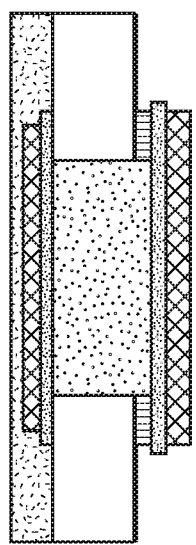
FIG. 6B illustrates a cross-sectional view of a structure after an intermediary fabrication stage according to one or more embodiments of the present invention.
Figure 6C:
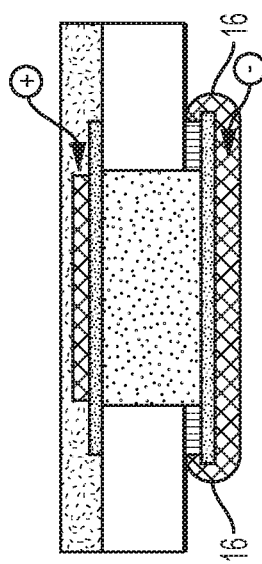
FIG. 6C illustrates a cross-sectional view of a structure after another intermediary fabrication stage according to one or more embodiments of the present invention.

As illustrated in FIGS. 6A-6C, the semiconductor device can include a micro-battery device. In an exemplary embodiment, the first bonding surface 12 and the second bonding surface 18 can be hermetically sealed together to form the cavity (FIG. 6C). The cavity can include any suitable electrolyte material, including but not limited to a liquid or a molten electrolyte.

Figure 7:
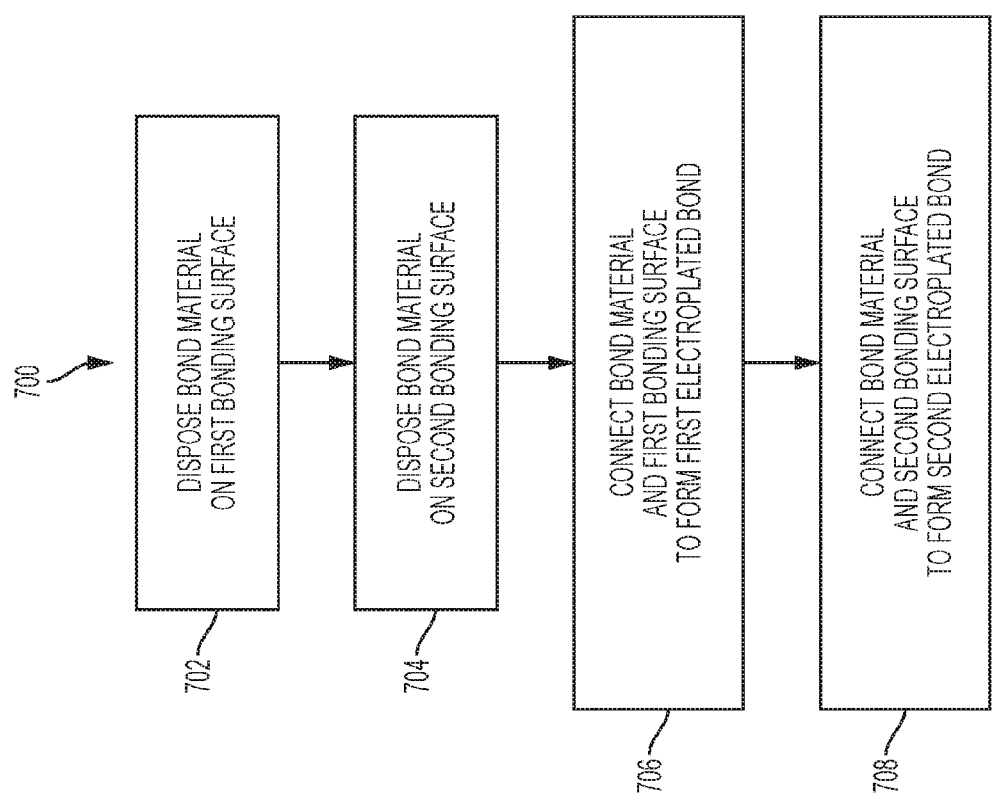
FIG. 7 depicts a flow diagram illustrating a methodology according to one or more embodiments of the present invention.

FIG. 7 illustrates a flow diagram 700 for a method for forming a semiconductor device according to one or more embodiments of the present invention. A bond material is disposed on a first bonding surface 702. The bond material is also disposed on a second bonding surface 704. The bond material is connected with the first bonding surface to form a first electroplated bond 706. The bond material is also connected with the second bonding surface to form a second electroplated bond 708.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A device comprising: a first component having a first bonding surface; a second component having a second bonding surface;

an adhesive between a portion of the first and second bonding surfaces and a gap between another portion between the first and second bonding surfaces; and an electroplated bond material in at least the gap to define an atomic level hermetic seal so as to couple the first bonding surface to the second bonding surface.

2. The device of claim 1, wherein the bond material comprises a metal or a metal alloy.

3. The device of claim 1, wherein the first bonding surface and the second bonding surface comprise different materials.

4. The device of claim 1, wherein the first bonding surface and the second bonding surface each independently comprises zinc or an alloy thereof, nickel or an alloy thereof, tin or an alloy thereof, indium or an alloy thereof, copper or an alloy thereof, gold or an alloy thereof, or a combination of the foregoing.

5. The device of claim 1, wherein the at least one of the first bonding surface or the second bonding surface comprises a metal alloy.

6. The device of claim 5, wherein the metal alloy comprises SnAg, SnAu, SnBi, ZnIn, ZnBi, or a combination thereof.

7. The device of claim 1, wherein at least one of the first component and the second component is a material selected from a silicon oxide, a ceramic, a polymer laminate, or a combination thereof.

8. The device of claim 1, wherein the first and second component define a hermetically sealed cavity.

9. The device of claim 8, further comprising a sensor device disposed within the cavity.

10. The device of claim 8, wherein the gap has a height defined by a thickness of the adhesive.

* * * * *